United States Patent
Teo et al.

(10) Patent No.: US 7,453,154 B2
(45) Date of Patent: Nov. 18, 2008

(54) CARBON NANOTUBE VIA INTERCONNECT

(75) Inventors: Kiat Choon Teo, Singapore (SG); Wai Kwan Wong, Singapore (SG); Binghua Pan, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 327 days.

(21) Appl. No.: 11/391,852

(22) Filed: Mar. 29, 2006

(65) Prior Publication Data
US 2007/0228926 A1   Oct. 4, 2007

(51) Int. Cl.
   *H01L 21/44* (2006.01)
(52) U.S. Cl. .................. 257/777; 257/E51.04
(58) Field of Classification Search .......... 439/68, 439/75; 257/734, 776, 777, 780, 686, E51.04; 361/772, 777; 438/613, 614, 680
   See application file for complete search history.

(56) References Cited

U.S. PATENT DOCUMENTS

| | | | |
|---|---|---|---|
| 6,383,923 B1 * | 5/2002 | Brown et al. ............ | 438/666 |
| 6,831,017 B1 * | 12/2004 | Li et al. ................ | 438/694 |
| 6,933,222 B2 | 8/2005 | Dubin et al. | |
| 6,946,739 B2 | 9/2005 | Ring | |
| 6,959,856 B2 * | 11/2005 | Oh et al. ............... | 228/245 |
| 6,989,325 B2 * | 1/2006 | Uang et al. ............ | 438/613 |
| 7,129,567 B2 * | 10/2006 | Kirby et al. ............ | 257/621 |
| 7,268,077 B2 * | 9/2007 | Hwang ................. | 438/680 |
| 7,301,779 B2 * | 11/2007 | Honlein et al. .......... | 361/772 |
| 2005/0142933 A1 * | 6/2005 | Beer et al. ............. | 439/540.1 |
| 2005/0285116 A1 * | 12/2005 | Wang ................... | 257/76 |
| 2006/0278992 A1 * | 12/2006 | Trezza et al. ........... | 257/777 |

OTHER PUBLICATIONS

Riley, George A., "Wafer-level Hermetic Cavity Packaging", *Advanced Packaging*, May 2004, 10 pages.

\* cited by examiner

*Primary Examiner*—Neil Abrams
(74) *Attorney, Agent, or Firm*—Jimmy L. Funke

(57) ABSTRACT

An electronic device that facilitates improved electrical and thermal performance and/or allows fabrication of smaller electronic devices exhibiting excellent performance characteristics, especially for devices operating at microwave frequencies, includes an input/output pad, and a carbon nanotube extending from the input/output pad to provide wafer-level nano-interconnect for flip chip interconnections and die stacking on a substrate.

3 Claims, 2 Drawing Sheets

CARBON NANOTUBE VIA INTERCONNECT

TECHNICAL FIELD

This invention relates to integrated circuitry, and more particularly to improved via interconnects at wafer-level for electrically connecting surface mount integrated circuits to other devices or to a substrate, such as a printed circuit board or other package carrier.

BACKGROUND OF THE INVENTION

There is a constant demand for electronic devices having smaller features that are more densely crowded together on a single substrate or chip. At the same time, consumers of such devices are demanding faster operating speeds and higher reliability, such as are achieved with monolithic microwave integrated circuits (MMICs). Monolithic microwave integrated circuits are formed of a plurality of devices or circuit components that are fabricated on a single semiconductor substrate, and are designed to operate at microwave frequencies, which are generally regarded to be between about 3,000 and 300,000 microns, corresponding to operating frequencies of from about 1 to about 100 gigahertz (GHz).

As is well known to those who design integrated circuits or use integrated circuits in the design of various electronic packages, the performance characteristics of electronic devices operating in the microwave frequency range are highly susceptible to deleterious effects caused by stray capacitances and inductances that can be generated at wire bonds of the type that have been conventionally used to electrically connect terminals of an integrated circuit device to a substrate (e.g., a printed circuit board) or another integrated circuit device.

In order to reduce stray capacitances and inductances, surface mount chip technology that eliminates wire bonding has been utilized. Flip chips are a type of integrated circuit device that is surface mounted and does not require any wire bonds. Instead, the flip chip has solder beads (also referred to as solder bumps or solder balls) on the terminals (also referred to as I/O pads) of the integrated circuit device. The solder beads are typically located around the perimeter or full array of the device, and are mounted to a substrate such as a printed circuit board or other package carrier by positioning the solder beads in registry with appropriate contact pads on the substrate, and heating the solder beads following an appropriate temperature profile to cause reflow of the solder beads. Upon subsequent cooling, wireless interconnections between the integrated circuit device and a circuit pattern defined on the substrate are formed. The use of flip chip technology has several recognized advantages, including reduced signal inductances, reduced power/ground inductances, higher signal density, reduced package footprint and better accuracy due to self-alignment of die by solder bumps.

The use of carbon nanotube technology in the fabrication of integrated circuits has been proposed. For example, U.S. Pat. No. 6,933,222 describes integrated circuits comprising layers of arrays of carbon nanotubes separated by dielectric layers with conductive traces formed within the dielectric layers to electrically interconnect individual carbon nanotubes. The integrated circuit devices are fabricated by selectively depositing carbon nanotubes onto catalysts selectively formed on a conductive layer at the bottom of openings in a dielectric layer. The use of carbon nanotube electrical conductors in these devices is limited to the provision of electrical connections between different circuit layers of an integrated circuit having multiple circuit layers.

SUMMARY OF THE INVENTION

In an aspect of this invention, there is provided a technique of electrically interconnecting circuit components using carbon nanotubes as electrical conductors. The carbon nanotube interconnects may be used for electrically connecting an integrated circuit device, such as a flip chip, to another integrated circuit device (die stacking), or to a substrate, such as a printed circuit board or other package carrier. It is envisioned that this technology will be particularly useful for fabrication of sophisticated integrated circuit chips and nano-devices (e.g., NEMS), as well as multiple-die stacking interconnects to achieve better electrical and thermal performance and achieve fabrication of smaller, denser electronic devices exhibiting excellent performance characteristics, especially those operating at microwave frequencies.

The invention employs carbon nanotubes as electrical interconnects using flip chip technology. The invention may be implemented at wafer level, and can be applied to a variety of nano-scale and wafer-level devices, including conventional integral circuits (ICs), microelectromechanical systems (MEMS) and nanoelectromechanical systems (NEMS), making use of the advantages of carbon nanotubes, which may be grown using known techniques.

The carbon nanotubes may be grown directly on input/output pads (e.g., aluminium or copper) of an electronic device (e.g., IC, MEMS or NEMS devices) to facilitate employment of a flip chip technique for interconnecting with other devices or with a printed circuit board. This invention can be cost effectively employed at wafer level, with CNTs grown prior to wafer sawing, in addition to three dimensional die stacking during device mounting or interconnect.

These and other features, advantages and objects of the present invention will be further understood and appreciated by those skilled in the art by reference to the following specification, claims and appended drawings.

DESCRIPTION OF THE PREFERRED EMBODIMENTS

Figure 1:
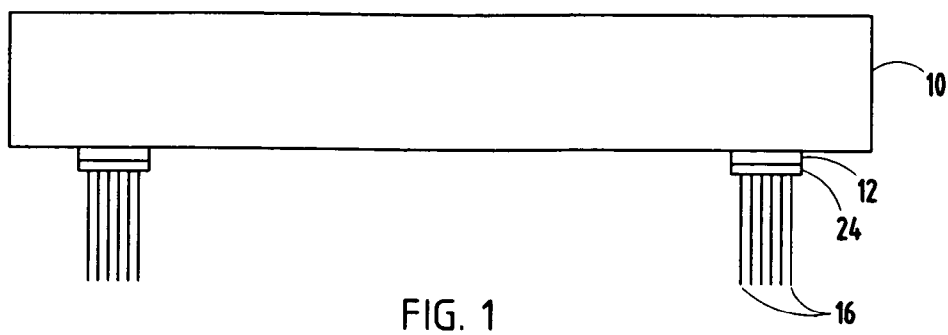
FIG. 1 is a schematic side elevational view of an integrated circuit device employing carbon nanotube via interconnects in accordance with the invention.

In FIG. 1, there is shown an integrated circuit device 10. Device 10 includes an electrically conductive input/output (I/O) pad 12 (e.g., aluminium, copper, etc.) on which a catalyst layer 24 is deposited. Suitable catalysts for growing carbon nanotubes, and techniques for depositing catalyst layer 24 are well known. Device 10 has a carbon nanotube via interconnect comprising at least one carbon nanotube 16 directly grown on I/O pads 12 of IC device 10. Normally numerous carbon nanotubes are grown on each pad. A solder bead optionally deposited on a metal terminal to complete a flip chip device in which a reflow technique may be used for electrically and mechanically connecting integrated circuit device 10 to another device or to a substrate or package carrier such as a printed circuit board. CNT growth is done at wafer level. After wafer sawing, individual IC or MEMS/NEMS device may be flip chip mounted on a substrate or second device, using flux (with optional pre-formed solder bead on CNTs) or solder paste (without optional solder bead), followed by reflow.

Figure 2:
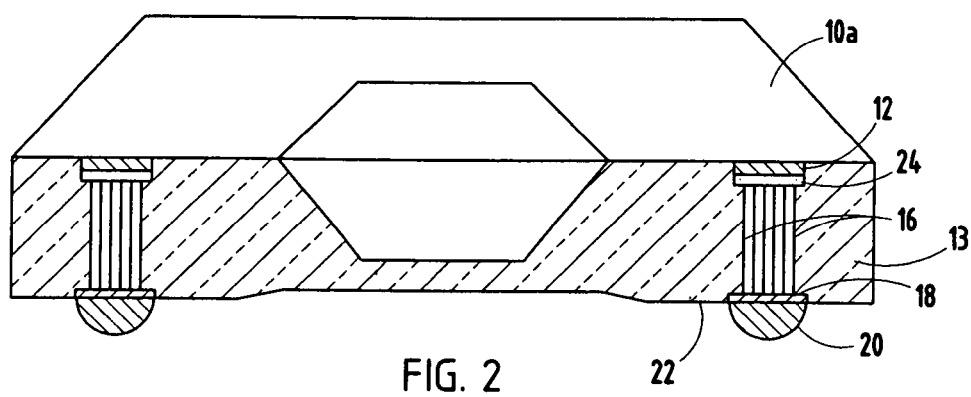
FIG. 2 is a schematic side elevational view of a MEMS or NEMS device employing carbon nanotube interconnects in accordance with the invention.

In FIG. 2, there is shown a MEMS or NEMS device 10A which may have a dielectric substrate 13 (e.g., glass, ceramic, silica, etc.) which is referred to as an interposer to protect and seal MEMS devices. An opening or via is formed, such as by employing conventional dry or wet deep etching techniques. However, any technique capable of forming a suitable opening or via through substrate 13 may be employed. The opening has a diameter that is typically from about tens to several hundred microns in diameter. Normally numerous carbon nanotubes are grown in each via or opening. The opening or via is formed at an appropriate location in which a carbon nanotube conductor 16 may be grown or deposited to provide an electrical connection between a conductor or semiconductor of the device and another device or printed circuit board.

A catalyst 24 is deposited directly on I/O metal pads 12. Thereafter, a conventional technique for growing carbon nanotubes 16 is employed. Optionally, a metal terminal 18 may be deposited on substrate 13 at the terminal end of carbon nanotubes 16, and a solder bead 20 may be deposited over terminal 18 to facilitate subsequent interconnection of device 10a with another device or printed circuit board using a flip chip technique.

Carbon nanotubes 16 are synthesized or grown from a catalytic surface. More specifically, a catalyst is deposited directly on all the I/O pads (Al or Cu mostly) of MEMS/NEMS device 10a on an exposed portion of integrated circuit 10a at a bottom of the opening or via, and the carbon nanotubes (CNTs) are grown or deposited using known deposition techniques such as plasma enhanced chemical vapor deposition (PECVD). Catalyst 24 comprises suitable materials such as cobalt, nickel, iron, or combinations thereof. Optionally, after carbon nanotubes 16 have been deposited in the via or opening, metal terminal 18 may be deposited on exposed surface 22 of substrate 13 using generally any suitable metal deposition technique such as sputtering, physical vapor deposition or chemical vapor deposition. Examples of suitable metals that may be deposited to form terminal 18 include titanium, chromium, copper, nickel, gold, silver, and combinations thereof. Prior to deposition of the catalyst layer 24 on the exposed surface of integrated circuit 10a, and after forming of an opening through which the carbon nanotubes are deposited or grown, the opening may be subjected to thermal oxidation in order to narrow the diameter of the opening.

The illustrated embodiments of FIGS. 1 and 2 represent hypothetical devices having only two interconnects. It will be understood that a typical device may include any number of carbon nanotube via interconnects on each I/O pads. The diameter, length and density of CNTs are controllable by all those well known conventional CNT growth techniques. Solder wettable metallic coatings e.g., Ti/Ni/Au, are to be deposited on all exposed CNTs to prepare them to be solder wettable prior to any solder deposition process. This can be done at the wafer-level immediately after CNT growth.

Figure 3:
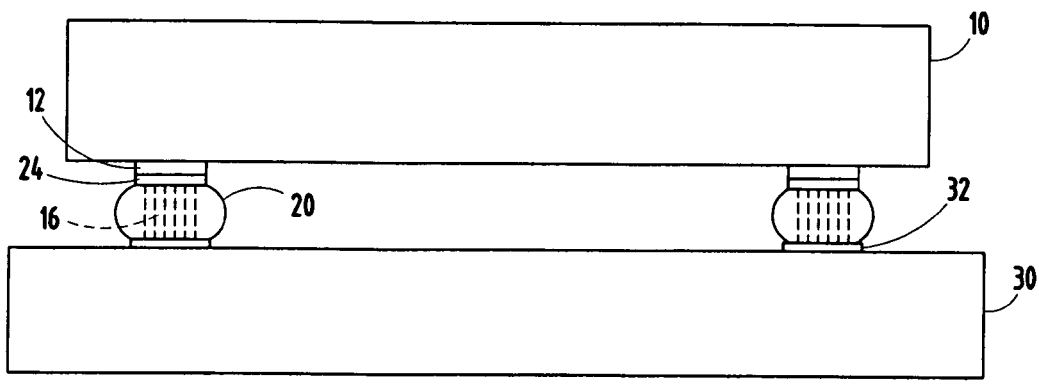
FIG. 3 is a schematic side elevational view of an electronic assembly or package employing carbon nanotube interconnects for electrically and mechanically connecting an electronic device to a substrate.

As can be seen by reference to FIG. 3, integrated circuit device 10 (also applied to 10a) may be mounted on a conventional substrate or package carrier, such as a printed circuit board 30 having contact pads 32. Substrate can be any common type such as PCB, Flex, Lead Frame, Hybrid Ceramic, HTCC and LTCC etc. Conventional flip chip solder reflow techniques may be employed for achieving the desired electrical and mechanical connections. CNTS will touch on pads 32 on substrate 30 after reflow due to solder surface tension and controlled solder amount.

The principles of this invention are not only applicable to individual devices such as IC 10, or MEMS or NEMS device 10A, but are also applicable to die stacking. Die stacking may be advantageously employed for devices having I/O pads that can be brought off the stack together, with just a few I/Os brought off separately.

Figure 4:
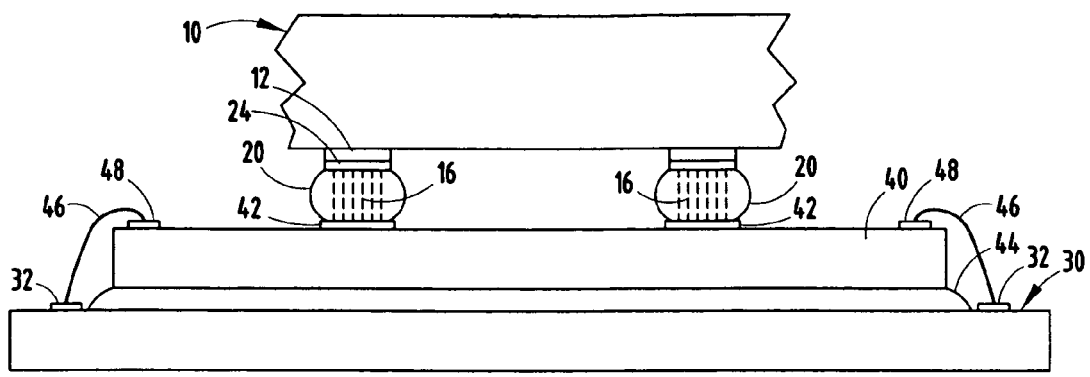
FIG. 4 is a schematic side elevational view of an electronic package in accordance with an alternative embodiment of the invention in which carbon nanotube interconnects are employed for electrically and mechanically connecting an electronic device to another electronic device which is mounted on a substrate and interconnected using wire bonding technique.

As another alternative, as shown in FIG. 4, integrated circuit device 10 (or 10a) may be mounted to another integrated circuit device 40 by electrically and mechanically connecting CNTs 16 of integrated circuit device 10 to contacts (mounting pads) 42 of integrated circuit device 40 with solder joints 20 formed using conventional flip chip solder reflow techniques. Integrated circuit device 40 may be mechanically bonded to a substrate 30 (e.g., a printed circuit board) using an adhesive 44, and may be electrically connected using a wire 46 connecting contact pad 48 of integrated circuit device 40 with contact pad 32 of substrate 30.

Figure 5A:
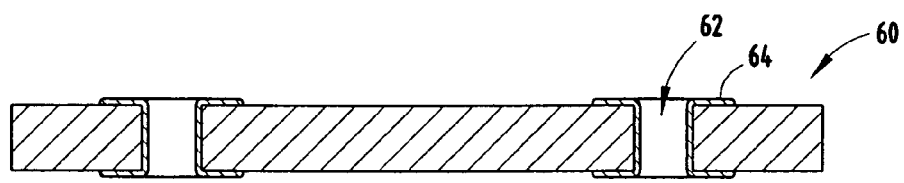
FIG. 5A is a side elevational view of a device having through wafer openings or vias for accommodating carbon nanotube interconnects of a second device to be stacked thereon.
Figure 5B:
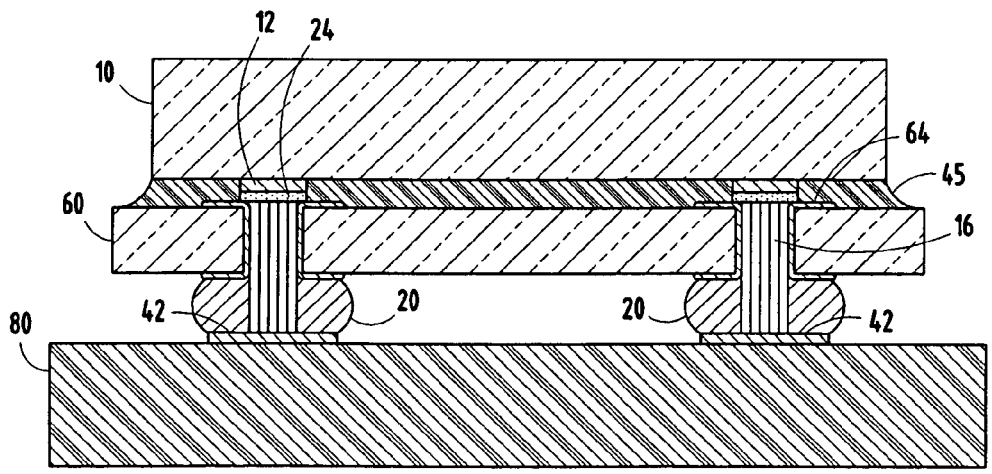
FIG. 5B is a side elevational view of an electronics package having stacked chips or dies employing carbon nanotube interconnects in accordance with the invention mounted on a substrate.

As shown in FIG. 5B, a device 10 (as shown in FIG. 1 ) having CNTs 16 can be flip chip mounted on a second device 60 which can be either flip chip mounted on a substrate 80 (as shown in FIG. 5B), or wire bonded (such as shown in FIG. 4 for device 40 ). Device 10 is mechanically secured to device 60 using an adhesive 45 which is preferably electrically insulating and which may not be the same as adhesive 44 in FIG. 4, which can be either electrically conducting or insulating. Device to device bonding techniques, such as for silicon to silicon or silicon to glass, using adhesives are well known. Device 60 has through wafer openings or vias 62 that are partially or fully plated by a through hole conducting media 64 (e.g., copper). The circuitry of device 60 is designed to match I/O pad locations of device 10 with openings 62.

Vias 62 of device 60 can be formed using convention techniques, such as dry or wet deep etching techniques, similar to those used for making vias in device 10A (FIG. 2 ). Dummy pads and openings/vias as well as circuitry re-routing (re-distribution) on both devices 10 and 60 may be used during circuit design and assembly to match all of the I/Os of both devices 10 and 60, and mounting pads of substrate 30. This technique requires only a single CNT growth step, rather than multiple CNT growth steps. The circuitry should also be designed to allow matching of openings 62 with CNT bumps 16.

Conductive plating 64 may be deposited on the surface of opening/vias 62 using conventional techniques, such as copper plating. Plating 64 may act as a metallic solder wetting media during flip chip assembly, so as to electrically and mechanically connect I/Os of devices 10 and 60 and mounting pads 42 of substrate 30 together. CNTs are grown on I/O pads 12 from a catalyst layer 24 on device 10 and protrude through openings 62 of device 60 during bonding of these two devices.

In any of the package arrangements shown in FIGS. 3, 4 or 5B, a completed integrated circuit package may include overmolding, underfilling or encapsulation.

Figures 6A, 6B, 6C:
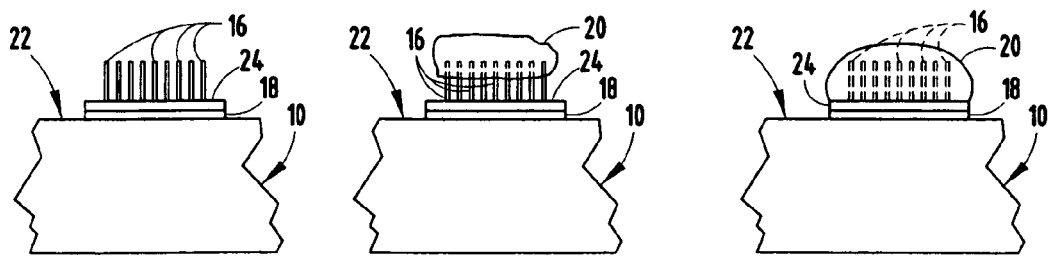
FIGS. 6A-6C are schematic side elevational views illustrating a technique for forming a solder bead at a terminal end of the carbon nanotube via interconnect.

As shown in FIGS. 6A, 6B and 6C, the carbon nanotube solder joint has carbon nanotubes 16 extending into and substantially through optional solder bead 20. This can be achieved by growing or depositing carbon nanotubes 16 sufficiently so that they extend beyond surface 22 of device 10 or 10a by a distance substantially equal to the combined thickness of optional metal terminal 18 and solder bead 20. Optional metal terminal 18 is deposited before CNT growth, and then solder 20 is disposed on carbon nanotube 16 as shown in FIG. 6B. Thereafter, solder reflow is used to form bead 20 as shown in FIG. 6C. To enhance solder wetting, the carbon nanotubes 16 may be exposed through a shadow mask and sputtered with titanium, nickel, gold or other conductive metal prior to solder application. Solder 20 is deposited using solder pastes of finer particle size such as Type 5 or Type 6.

As stated above, metal terminals 18 and solder beads 20 are optional. Devices 10, 10A with CNTs on pads can be singulated and then directly mounted on substrates, or on or underneath a second IC using conventional solder paste deposition and flip chip mounting techniques, followed by reflow to form the joints. This technique eliminates a need for metal terminals 18 and/or solder beads 20.

If desired, solder beads 20 can be fabricated on device 10, 10A at the wafer-level prior to individual singulation (wafer sawing), employing techniques similar to those conventionally used for producing wafer-level packages.

If desired, optional terminals 18 may be deposited before CNT growth on a surface surrounding the via and may or may not be deposited within the via barrel.

Table 1 shows approximate values of specific properties of copper versus carbon nanotubes conductors reported in the literature.

TABLE 1

Specific Properties of Copper vs Carbon Nanotubes (CNTs)

| | Electrical/Thermal Properties (SWNT) | | Mechanical Properties (SWNT) | |
|---|---|---|---|---|
| | Copper | CNT | Copper | CNT |
| Thermal Conductivity | 390 W/mK | 3000 W/mK | Young's Modulus | 108-117 GPa | 1 TPa |
| Electrical Resistivity | $1.65 \times 10^{16}$ Ohm/cm | $<10^{-4}$ Ohm/cm | Tensile Strength | 137-618 MPa | 30 GPa |
| Current Density | $<10^7$ A/cm$^2$ | $10^{12}$ A/cm$^2$ | | | |

Interconnects using electrically conducting carbon nanotubes offer several advantages. As shown in the table, carbon nanotubes exhibit extremely high electrical and thermal conductivity, excellent mechanical strength with high flexibility and excellent high current density. Further, the smaller diameter of the carbon nanotubes reduces the electrical skin effect. High aspect ratio growth of carbon nanotubes is possible. The carbon nanotube via interconnects of the invention provide versatile interconnection between integrated circuit devices, as well as microelectromechanical systems (MEMS) and NEMS. The carbon nanotube via interconnects also facilitate the fabrication of very small integrated circuit packages, e.g., package sizes that approach the dimensions of an integrated circuit chip. The carbon nanotube via interconnects of this invention may eliminate the need for underfill in flip chip processes.

The use of CNT interconnects in conjunction with flip chip and/or die stacking techniques can further increase interconnection density, reduce power use, reduce connection path length, and provide improved thermal performance.

It will be appreciated by those skilled in the art that the various integrated circuits, MEMS, and NEMS devices are typically manufactured by fabricating a plurality of devices on a single wafer and subsequently sawing or otherwise singulating the wafer to form a plurality of separate devices.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:
1. An electronic package comprising:
a first electronic device including an electronic circuit having an input/output pad, and at least one electrically conductive carbon nanotube extending from the input/output pad and beyond a surface of the device to provide an interconnect;
a second electronic device, the first electronic device mounted on the second electronic device to form a stacked arrangement;
a substrate, the stacked arrangement mounted on the substrate, the carbon nanotube extending away from the first electronic device, through an opening in the second electronic device, and connected to the substrate.

2. The electronic package of claim 1, wherein the carbon nanotube projects outwardly away from a metal terminal fabricated on a surface of the first electronic device.

3. The electronic package of claim 2, wherein a solder bead encapsulates at least a portion of the carbon nanotube which extends outwardly away from the metal terminal.

* * * * *